United States Patent [19]

Boezen et al.

[11] Patent Number: 5,097,225
[45] Date of Patent: Mar. 17, 1992

[54] AMPLIFIER WITH SHORT-CIRCUIT PROTECTION

[75] Inventors: Hendrik Boezen; Pieter Buitendijk; Rudolf W. Mathijssen, all of Nijmegen, Netherlands

[73] Assignee: U. S. Philips Corporation, New York, N.Y.

[21] Appl. No.: 547,740

[22] Filed: Jul. 3, 1990

[30] Foreign Application Priority Data

Jul. 6, 1989 [NL] Netherlands ............... 8901726

[51] Int. Cl.$^5$ .......................... H02H 7/20
[52] U.S. Cl. ................... 330/298; 330/207 P
[58] Field of Search ............ 330/207 P, 288, 295, 330/298, 146; 455/117

[56] References Cited

U.S. PATENT DOCUMENTS 4,414,514 11/1983 Seki et al. ............ 330/207 P X
4,607,235 8/1986 Seevinck ................ 330/298

FOREIGN PATENT DOCUMENTS

0132863 2/1985 European Pat. Off. .

*Primary Examiner*—Steven Mottola
*Attorney, Agent, or Firm*—Bernard Franzblau

[57] ABSTRACT

An amplifier circuit in which a first amplifier (A1) and a second amplifier (A2) are protected against short-circuits by a protection apparatus which includes a first device (M1), a second device (M2), a third device (M3) and a protection device (B). For this purpose the first device and the second device generate four signals (s1, s2, s3, s4) related to an equal number of currents (i1, i2, i3, i4), which currents are related to a first or a second load current in the first amplifier or in the second amplifier. In order to control the protection device (B), the third device generates at least two control signals (r1, r2) related to the signal currents (s1, s2, s3, s4), use being made of the equality of the load currents in the absence of short-circuits.

18 Claims, 5 Drawing Sheets

AMPLIFIER WITH SHORT-CIRCUIT PROTECTION

BACKGROUND OF THE INVENTION

This invention relates to an amplifier arrangement comprising a first amplifier having a first output terminal for connection to a first terminal of a load, and having at least a first transistor for supplying a first current related to a first load current flowing via the first output terminal, first means for generating a first signal which is a measure of the first current, a second amplifier having a second output terminal for connection to a second terminal of the load, and having at least a second transistor for supplying a second current related to a second load current flowing via the second output terminal, second means for generating a second signal which is a measure of the second current, and protection means for limiting the first and the second load current in order to protect the first and the second amplifier.

In general, such an amplifier arrangement can be used for driving a load coupled between two amplifiers, which amplifiers are protected against supplying excessive load currents, and in particular the arrangement is suitable for use in car radios, where short circuits to ground always constitute a problem.

Such an amplifier arrangement is generally known because most amplifier arrangements comprise a protection device for protecting the amplifiers used in the arrangement. This protection device comprises means for generating one or more signals which are each a measure of a current or voltage related to the load currents and also comprises protection means which are responsive to said signals to limit the load currents. In amplifier arrangements of the type defined in the opening paragraph the two amplifiers are each protected in a substantially identical way. One possibility of implementing the protection of an amplifier is disclosed in European Patent Application 0,132,863. In said amplifier the signal generating means generate two signals, which are measures of a load-current-related current and voltage, respectively, and the protection means comprise a control amplifier. This control amplifier is driven if the difference between the two signals exceeds a threshold value and thereby limits the amplifier drive and thus the load current. The known protection devices protect the amplifiers against short-circuits to ground, but comparatively small short-circuit currents are not detected. These short-circuit currents give rise to a loss of power and may cause thermal damage to the amplifier arrangement.

SUMMARY OF THE INVENTION

Therefore, it is an object of the invention to provide an amplifier arrangement which comprises both amplifiers and a protection device and which is capable of detecting short-circuits independently of the magnitudes of the short-circuit currents.

An amplifier arrangement in accordance with the invention is characterized in that the amplifier arrangement further comprises third means for generating a first control signal which is a measure of the sum of the first and the second signals and which serves for control the protection means.

The invention is based on the recognition of the fact that when a short-circuit current occurs the first and the second load currents are no longer equal and that this deviation can be detected by comparing the first and the second signals with each other, which signals are related to the first and the second load currents. By this comparison and with the aid of the third means the first control signal for controlling the protection means is obtained.

A first embodiment of an amplifier arrangement in accordance with the invention may be characterized in that the third means comprise a current mirror having an input terminal for receiving the first signal and an output terminal for supplying both the second signal and the first control signal, and the third means may be characterized further in that the input terminal of the current mirror and the output terminal of the current mirror are coupled to one another by means of two series-coupled transistors each having a control electrode, a first main electrode and a second main electrode, the two control electrodes being coupled to a reference voltage terminal to receive a reference voltage, the two first main electrodes being coupled to a third terminal to receive both the first and the second signal, and the second main electrodes being coupled to the input terminal and the output terminal, respectively. This embodiment enables the sum of the first and the second signals to be formed in a simple manner. When the two series-coupled transistors are used the voltage on the third terminal, in relation to the reference voltage, dictates the magnitude of the control signal, which is a measure of the current via the third terminal.

A second embodiment of an amplifier arrangement in accordance with the invention may be characterized in that the first means comprise at least two transistors each having a control electrode, a first main electrode and a second main electrode, the control electrodes being coupled both to one another and to one first main electrode, the first main electrodes each being coupled to a current source, and the second main electrodes being coupled to one another by means of a pair of series-coupled resistors, one second main electrode being coupled to an input terminal to receive at least the first current and the other second main electrode being coupled to an output terminal to supply the first signal, and in that the second means comprise at least two transistors each having a control electrode, a first main electrode and a second main electrode, the control electrodes being coupled both to each other and to one first main electrode, the first main electrodes each being coupled to a current source, and the second main electrodes being coupled to one another by means of a second pair of series-coupled resistors, one second main electrode being coupled to an input terminal to receive at least the second current and the other second main electrode being coupled to an output terminal to supply the second signal. Both in the first and in the second means the two transistors with the associated pair of resistors constitute a degenerate current mirror, in which the currents through the transistors are dictated by the current sources and in which the voltages across the resistors as well as the values of the resistors determine the ratio between the first current and the first signal and the ratio between the second current and the second signal.

A third embodiment of an amplifier arrangement in accordance with the invention may be characterized in that the first amplifier further comprises at least a third transistor for supplying a third current related to the first load current flowing via the first output terminal, the first means are adapted to generate also a third signal which is a measure of the third current, the second amplifier further comprises at least a fourth transistor for supplying a fourth current related to the second load current flowing via the second output terminal, the second means are adapted to generate also a fourth signal which is a measure of the fourth current, and the third means are adapted to generate also a second control signal which is a measure of the sum of the third and the fourth signal and which serves to control the protection means, which third means may be characterized further in that they comprise two substantially identical devices for generating the first and the second control signal respectively. The first and the second means may be characterized further in that the first means further comprise at least two transistors each having a control electrode, a first main electrode and a second main electrode, the control electrodes being coupled both to each other and to one first main electrode, the first main electrodes each being coupled to a current source, and the second main electrodes being coupled to each other by means of a third pair of series-coupled resistors, one second main electrode being coupled to an input terminal to receive the third current and the other second main electrode being coupled to an output terminal to supply the third signal, and in that the second means comprise at least two transistors each having a control electrode, a first main electrode and a second main electrode, the control electrodes being coupled both to one another and to one first main electrode, the first main electrodes each being coupled to a current source, and the second main electrodes being coupled to one another by means of a fourth pair of series-coupled resistors, one second main electrode being coupled to an input terminal to receive the fourth current and the other second main electrode being coupled to an output terminal to supply the fourth signal. In this embodiment the first and the second amplifier constitute a bridge amplifier comprising at least four transistors. The currents through these transistors are related to the first or the second load current and serve as measures of the four signals which control the protection means via the third means.

A fourth embodiment of an amplifier arrangement in accordance with the invention may be characterized in that the first amplifier further comprises at least a third transistor for supplying a third current, related to the first load current flowing via the first output terminal, and the second amplifier further comprises at least a fourth transistor for supplying a fourth current related to the second load current flowing via the second output terminal, and in that the first signal is a measure of both the first and the fourth current and the second signal is a measure of both the second and the third current. The first and the second amplifier again form a bridge amplifier. By applying the first and the fourth currents to the first means and by applying the second and the third currents to the second means the number of components is reduced as compared with the third embodiment. Now the first, the second and the third means may be constructed as described for the first and the second embodiment, the two current pairs each driving the degenerate current mirror via a resistor.

A further embodiment of an amplifier arrangement in accordance with the invention may be characterized in that at least one of the means is further adapted to generate at least one further control signal which is a measure of one of the currents through the transistors and which serves for controlling the protection means. The use of a larger number of control signals enables the currents through the four transistors to be also limited in an absolute sense. This is in order to prevent both the amplifiers and the load from being overloaded.

BRIEF DESCRIPTION OF THE DRAWINGS

The invention will now be described in more detail, by way of example, with reference to the accompanying drawings, in which.

DESCRIPTION OF THE PREFERRED EMBODIMENTS

Figure 1:
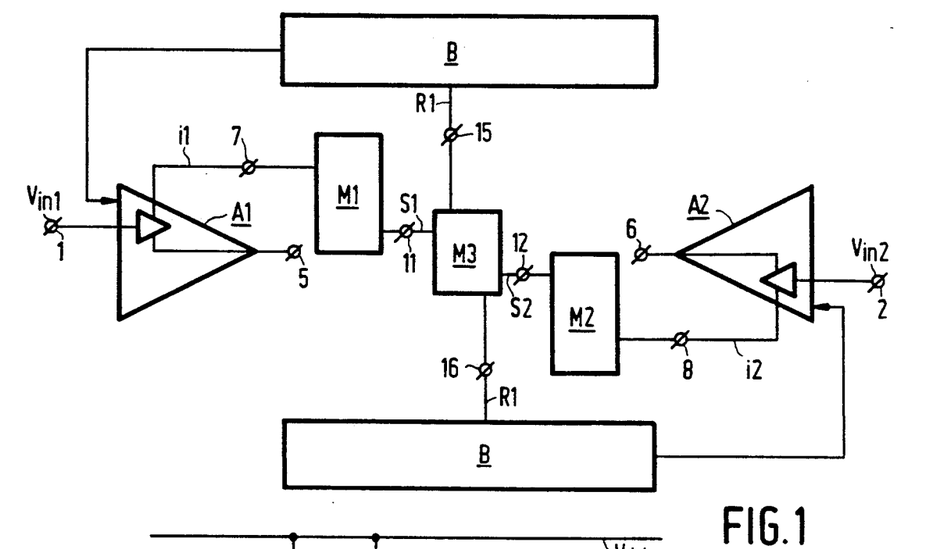
FIG. 1 is a first block diagram of an amplifier arrangement in accordance with the invention.

FIG. 1 shows a first block diagram of an amplifier arrangement in accordance with the invention. The arrangement comprises a first amplifier A1, a second amplifier A2 and a protection device comprising first means M1, second means M2, third means M3 and protection means B. The first amplifier A1 has an input terminal for receiving an input signal Vin1, an output terminal 5 for connection to a first terminal of a load, and a terminal 7 to which the first means M1 are connected. The second amplifier A2 has an input terminal 2 for receiving an input signal Vin2, an output terminal 6 for connection to a second terminal of the load, and a terminal 8 to which the second means M2 are connected. The third means M3 are coupled to the first means M1 via a terminal 11, to the second means M2 via a terminal 12, and to the protection means B via both a terminal 15 and a terminal 16. The protection means are coupled both to the first amplifier A1 and to the second amplifier A2. When a load is coupled between the two output terminals 5 and 6 and the two amplifiers A1 and A2 are driven with the input signals Vin1 and Vin2, respectively, a first load current will flow via the output terminal 5 and a second load current will flow via the output terminal 6. Moreover, a current i1 related to the first load current will flow via the terminal 7 and a current i2 related to the second load current will flow via the terminal 8. The currents i1 and i2 may each be, for example, a main electrode current of an output transistor. The first and the second means M1 and M2 are responsive to these currents i1 and i2, respectively, to generate signals s1 and s2, respectively. These signals s1 and s2 are applied to the third means M3 via the terminals 11 and 12, respectively, in which third means the signals s1 and s2 are compared and in which a control signal r1 is generated. This control signal r1 is equal to the sum, or the difference, of the signals s1 and s2. The control signal r1 controls the protection means B via the terminals 15 and 16, which protection means influence the amplifiers A1 and A2, if necessary. In the absence of a short-circuit of the output terminals 5 and 6 to one of the supply voltage terminals, the two load currents are equal and opposite so that the currents i1 and i2 are substantially equal in an absolute sense, which also applies to the signals s1 and s2. Consequently, the control signal r1 is substantially zero and the protection means B receive no drive. In the case of a short-circuit the control signal r1 is not zero. The protection means B are then controlled by the control signal r1 in order to protect the amplifiers A1 and A2. Moreover, the control signal r1 can be used for generating a warning signal, for example, by means of a lamp.

Figure 2:
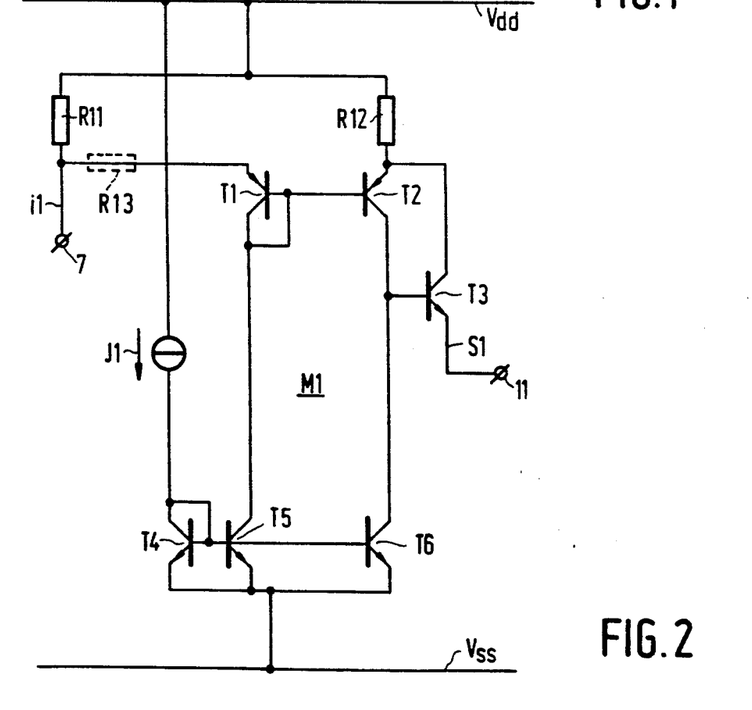
FIG. 2 shows an example of the first means for an amplifier arrangement in accordance with the invention.

FIG. 2 shows an example of the first signal generating means M1 for an amplifier arrangement in accordance with the invention, like parts bearing the same reference numerals as in FIG. 1. A transistor T1 and a transistor T2 form a current mirror, the first main electrode of the transistor T1 being coupled both to a supply voltage terminal Vdd via a resistor R11 and to the terminal 7, and the first main electrode of the transistor T2 being coupled both to the supply voltage terminal Vdd via a resistor R12 and to the second main electrode of a transistor T3, whose first main electrode is coupled to the terminal 11 and whose control electrode is coupled to the second main electrode of the transistor T2. The control electrodes of the transistors T1 and T2 are coupled to each other and are connected to the second main electrode of the transistor T1. Moreover, this embodiment comprises a second current mirror comprising the transistors T4, T5 and T6, whose control electrodes are coupled to each other and are connected both to the supply voltage terminal Vdd via a current source J1 and to the second main electrode of the transistor T4 and whose first main electrodes are coupled to a supply voltage terminal Vss. The transistors T5 and T6 have their second main electrodes coupled to the second main electrode of the transistor T1 and of the transistor T2, respectively. The transistors T5 and T6 each form a current source and respectively dictate the currents through the transistors T1 and T2 and the voltages across the first main electrode and the control electrode of the transistors T1 and T2. These voltages determine the ratio between the voltages across the resistors R11 and R12 in that the transistors T1 and T2 have their control electrodes coupled to each other and have their first main electrodes coupled to the supply voltage terminal Vdd via the resistors R11 and R12, respectively. In addition to the currents defined by the transistors T5 and T6 respectively, the current i1, which is related to the first load current, and the signal s1, which is applied to the third means M3, flow through the resistors R11 and R12. Since the ratio between the voltages across the resistors R11 and R12 is maintained equal by the bias currents of the transistors T1 and T2, a variation of the current i1 will result in a related variation of the signal s1. Consequently, the signal s1 is a measure of the current i1 and of the first load current. If the values of the resistors R11 and R12 are not equal it is possible to compensate for an offset in the transfer of the current i1 to the signal s1 by means of a resistor arranged in series with one of the first main electrodes of the transistors T1 and T2. For this purpose the arrangement shown in FIG. 2 comprises, for example, a resistor R13 arranged in series with the first main electrode of the transistor T1 in order to obtain an improved quiescent current setting. The transistor T3 provides independence of the voltage on the terminal 11 and of the magnitude of the current flowing via the terminal 11.

Figure 3:
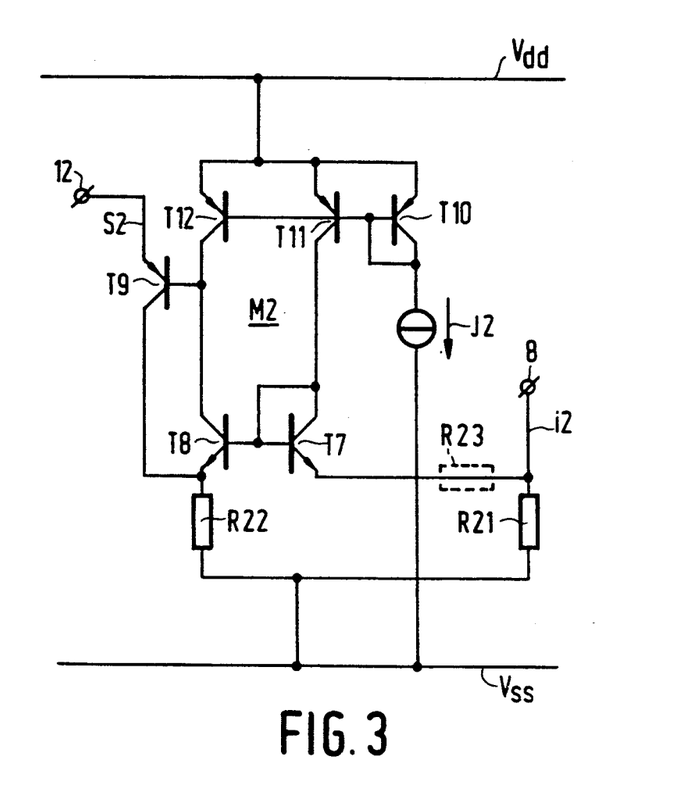
FIG. 3 shows an example of the second means for an amplifier arrangement in accordance with the invention.

FIG. 3 shows an example of the second signal generating means M2 for an amplifier arrangement in accordance with the invention, like parts bearing the same reference numerals as in the preceding Figures. In the present arrangement a transistor T7 and a transistor T8 form a current mirror. The first main electrode of the transistor T7 is coupled both to the supply voltage terminal Vss via a resistor R21 and to the terminal 8, and the first main electrode of the transistor T8 is coupled both to the supply voltage terminal Vss via a resistor R22 and to the second main electrode of a transistor T9, whose first main electrode is coupled to the terminal 12 and whose control electrode is coupled to the second main electrode of the transistor T8. The control electrodes of the transistors T7 and T8 are coupled to one another and are connected to the second main electrode of the transistor T7. This embodiment further comprises a second current mirror comprising the transistors T10, T11 and T12, whose control electrodes are coupled to one another and are connected both to the supply voltage terminal Vss via a current source J2 and to the second main electrode of the transistor T10 and whose first main electrodes are coupled to the supply voltage terminal Vdd. The second main electrodes of the transistors T11 and T12 are coupled to the second main electrode of the transistor T7 and that of the transistor T8, respectively. The arrangement shown in FIG. 3 only differs from the arrangement shown in FIG. 2 in that the supply voltages Vdd and Vss have been interchanged and in that transistors of another type have been used. However, the two arrangements operate in a similar way so that it is easy to see that the signal s2 flowing via the terminal 12 is a measure of the current i2 which flows via the terminal 8 and which is related to the second load current. In order to obtain an improved quiescent current setting it is also possible to arrange a resistor R23 in series with the first main electrode of the transistor T7 in the present embodiment.

Figure 4:
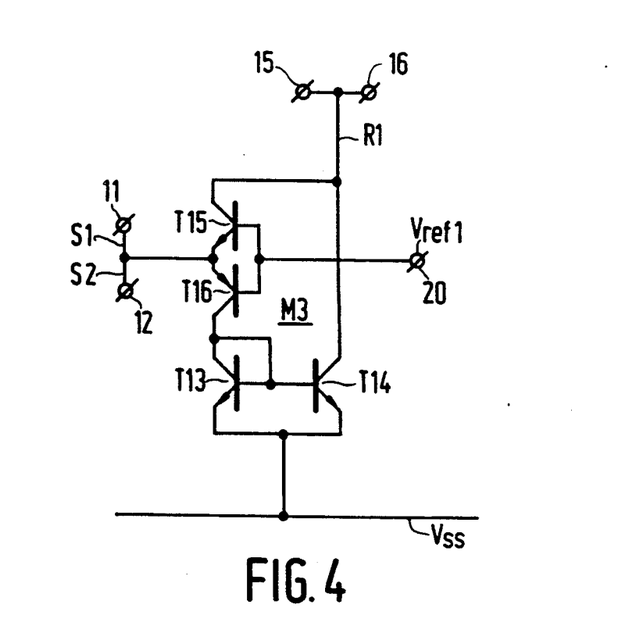
FIG. 4 shows an example of the third means for an amplifier arrangement in accordance with the invention.

FIG. 4 shows an example of the third signal generating means M3 for an amplifier arrangement in accordance with the invention, like parts again bearing the same reference numerals as in the preceding Figures. A transistor T13 and a transistor T14 constitute a current mirror. The first main electrodes of said transistors are coupled to the supply voltage terminal Vss. Moreover, this embodiment comprises two series-connected transistors T15 and T16 having first main electrodes which are both coupled to the terminal 11 and the terminal 12 and whose control electrodes are both coupled to a reference voltage terminal 20 to receive a reference voltage Vref1. The second main electrode of the transistor T15 is coupled both to the second main electrode of the transistor T14 and to the terminals 15 and 16. The second main electrode of the transistor T16 is coupled to the second main electrode of the transistor T13 and to the control electrodes of the transistors T13 and T14. This circuit forms the sum of the signal s1 flowing via the terminal 11 and the signal s2 flowing via the terminal 12. Since the signals s1 and s2 have opposite polarities as a result of the mutual orientation of the current mirrors in the means M1 and M2, the control signal r1 flowing via the terminals 15 and 16 represents the sum of the signals s1 and s2. The control signal r1 serves for control the protection means B. It is not necessary to utilize a threshold circuit. Depending on the polarity of the current applied to the first main electrodes of the transistors T15 and T16 resulting from the sumation of the opposite signals s1 and s2, one of the transistors will conduct. In the case of a current flowing away from the two first main electrodes the transistor T15 will conduct and the transistors T13, T14 and T16 will be cut off. The current through the transistor T15 will then be substantially equal to the control signal r1. In the case of a current which flows to the two first main electrodes the transistor T16 will conduct and the transistor T15 will cut off. By means of the current mirror comprising the transistors T13 and T14 the control signal r1 will then be dictated by the current through the transistor T16. In this embodiment the polarity of the control signal r1 is identical in both cases.

Figure 5:
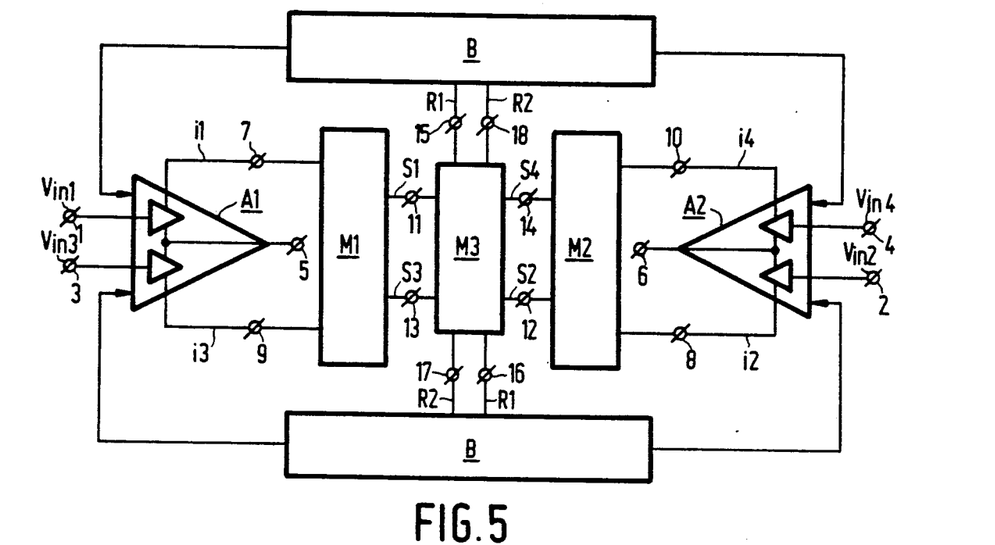
FIG. 5 is a second block diagram of an amplifier arrangement in accordance with the invention.

FIG. 5 shows a second block diagram of an amplifier arrangement in accordance with the invention, like parts bearing the same reference numerals as in the preceding Figures. In comparison with FIG. 1 this block diagram has some extensions. For example, the first amplifier A1 comprises a further input terminal 3 for receiving an input signal Vin3 and a further terminal 9, to which the first means M1 are connected. The second amplifier A2 comprises a further input treminal 4 for receiving an input signal Vin4 and a further terminal 10 to which the second means M2 are connected. Moreover, the first means M1 and the second means M2 are coupled to the third means M3 via a further terminal 13 and a terminal 14, respectively, which third means are also coupled to the protection means B via a further terminal 17 and a terminal 18. The amplifiers A1 and A2 each comprise two amplifier elements which are each driven by an input signal. The amplifier elements of the amplifier A1 are each coupled to the protection means B and each supply a portion of the first load current, the current i1 being related to one portion and the current i3 flowing via the terminal 9 being related to the other portion. Each of the amplifier elements of the amplifier A2 is also coupled to the protection means B. They each supply a portion of the second load current, the current i2 being related to one portion and the current i4 flowing via the terminal 10 being related to the other portion. The first means M1, in relation to the currents i1 and i3, generate the signal s1 and a signal s3 flowing via the terminals 11 and 13, respectively. The second means, in relation to the currents i2 and i4 generate the signal s2 and a signal s4 flowing via the terminal 12 and 14, respectively. The third means M3 derive from the signals s1 and s2 the control signal r1 and from the signals s3 and s4 a control signal r2 flowing via the terminals 17 and 18. These control signals are employed by the protection means B in order to protect the amplifier elements. Thus, the currents i3 and i4 are processed similarly to the currents i1 and i2. This amplifier arrangement is very suitable for use in a bridge amplifier arrangement having a push-pull output stage.

Figure 6:
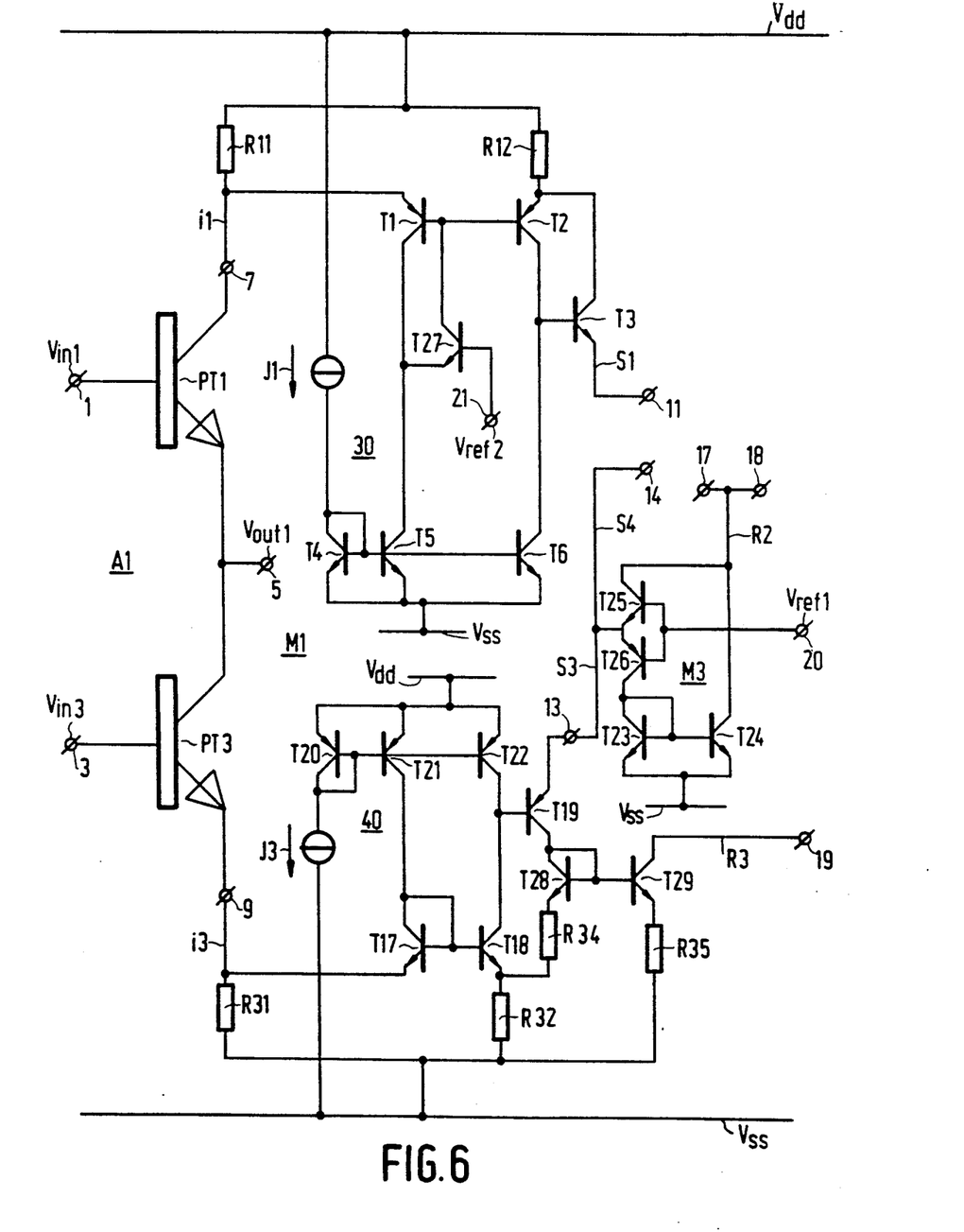
FIG. 6 shows a substantially mirror-symmetrical part of a bridge amplifier arrangement in accordance with the invention.

FIG. 6 shows an example of a substantially mirror-symmetrical part of a bridge amplifier arrangement in accordance with the invention, like parts again bearing the same reference numerals as in the preceding Figures. This embodiment is based on one half of the block diagram shown in FIG. 5. In this embodiment the amplifier elements of the first amplifier A1 are constituted by a transistor PT1 having its control electrode coupled to the terminal 1, its first main electrode to the output terminal 5 and its second main electrode to the terminal 7, and a transistor PT3 having its control electrode coupled to the terminal 3, its first main electrode to the terminal 9 and its second main electrode to the output terminal 5. The first means M1 comprise a circuit comprising two sections, of which the first section 30 corresponds to the arrangement shown in FIG. 2 and the other section 40 corresponds to the arrangement shown in FIG. 3, cmprising some additional elements. For example, the control electrode and the second main electrode of the transistor T1 are coupled to each other by means of a transistor T27 which has its first and its second main electrode connected respectively to the second main electrode and the control electrode of the transistor T1 and which has its control electrode coupled to a reference voltage terminal 21 to receive a reference voltage Vref2. In addition, the first main electrode of a transistor T18 and the second main electrode of a transistor T19 are coupled to each other by means of a resistor R34 and a transistor T28. Together with a transistor T29 the transistor T28 constitutes a current mirror for generating a control signal r3, which is related to the signal s3. For this purpose the transistor T29 has its first main electrode coupled to the supply voltage terminal Vss via a resistor R35, its second main electrode to the terminal 19 and its control electrode to the second main electrode of the transistor T19 and to the interconnected second main electrode and control electrode of the transistor T28, which has its first main electrode coupled to the first main electrode of the transistor T18 by the resistor R34. The third means M3 in FIG. 6 comprise a circuit corresponding to that shown in FIG. 4. In the complete amplifier arrangement the third means M3 should comprise at least two of said circuits and both the second amplifier A2 and the second means M2 will be substantially identical to the first amplifier A1 and the first means M1 respectively. The additional transistor T27 reduces the effect of supply-voltage variations on the currents through the transistors T1 and T2. The control signal r3 generated by the additional current mirror (T28, T29) directly constitutes a measure of the current supplied to the load by the transistor PT3 and will drive the protection means B via a threshold circuit in the case of an overload. Thus, the control signal r3 protects both the amplifier and the load against excessive currents. For the remainder the operation of the amplifier arrangement is similar to that described with reference to the preceding Figures.

Figure 7:
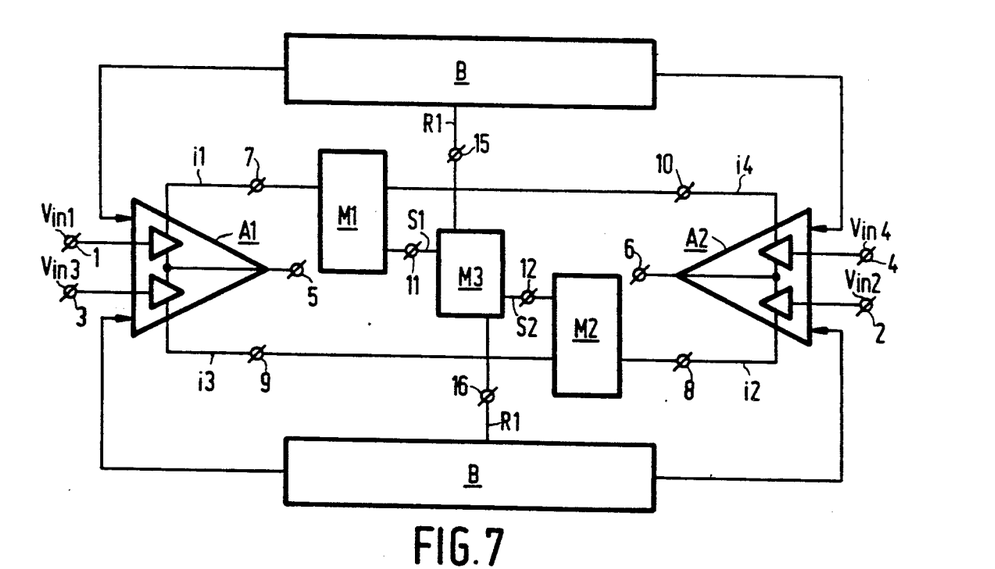
FIG. 7 shows a third block diagram of an amplifier arrangement in accordance with the invention.

FIG. 7 shows a third block diagram of an amplifier arrangement in accordance with the invention, like parts bearing the same reference numerals as in the preceding Figures. This block diagram represents a bridge amplifier, for which purpose the two amplifiers A1 and A2 again comprise two amplifier elements each. This bridge amplifier can be protected by means similar to those in the amplifiers A1 and A2 in FIG. 1 and is a simplified version of that shown in FIG. 5. The first means M1 receive the current i1 and the current i4 via the terminals 7 and 10, respectively, to generate the signal s1. The second means M2 receive the current i2 and the current i3 via the terminals 8 and 9, respectively, to generate the signal s2. By means of the signals s1 and s2 the third means M3 produce a control signal r1 with which the protection means B are controlled via the terminals 15 and 16. In a practical embodiment of this block diagram the terminals 7 and 10 may be coupled to each other so that the currents i1 and i4 both flow through the resistor R11, as employed, for example in the arrangement shown in FIG. 2. The terminals 8 and 9 may also be coupled to one another so that the currents i2 and i3 both flow through the resistor R21 as used, for example, in the arrangement shown in FIG. 3. The operation of the arrangement is similar to that of the arrangements shown in the preceding Figures.

Figure 8:
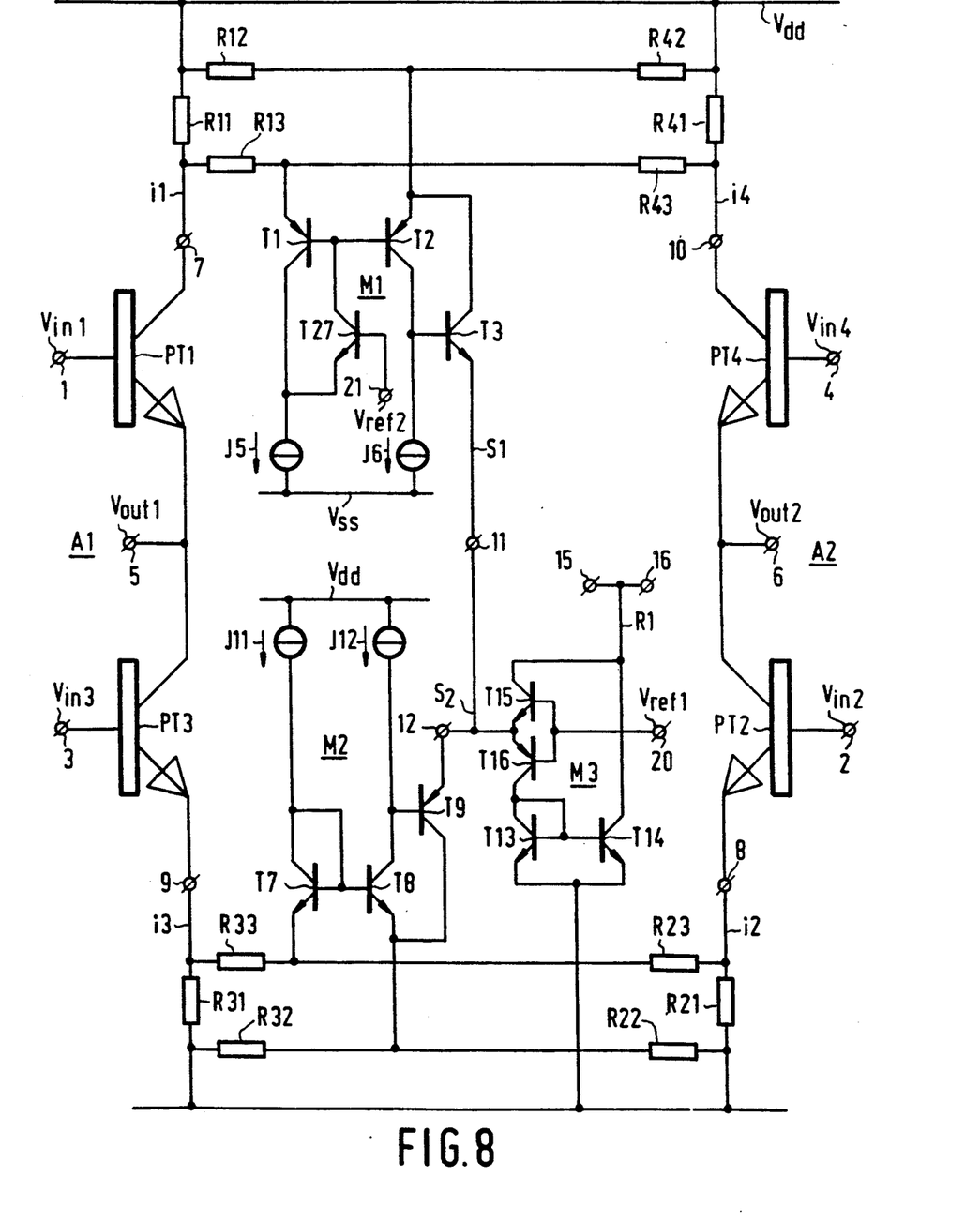
FIG. 8 shows an embodiment of a complete bridge amplifier arrangement in accordance with the invention.

FIG. 8 shows an embodiment of a complete bridge amplifier arrangement in accordance with the invention, like parts bearing the same reference numerals as in the preceding Figures. This embodiment is based on the block diagram shown in FIG. 7. Herein the amplifier elements of the second amplifier A2 comprise a transistor PT2, having its control electrode coupled to the terminal 2, having its first main electrode coupled to the output terminal 6 and having its second main electrode coupled to the terminal 8, and a transistor PT4, having its control electrode coupled to the terminal 4, having its first main electrode coupled to the terminal 10 and having its second main electrode coupled to the output terminal 6. The first means M1 comprise a circuit as shown in FIG. 2 but in which the second current mirror (T4, T5, T6) has been replaced by a current source J5 coupled to the second main electrode of the transistor T1 and by a current source J6 coupled to the second main electrode of the transistor T2. The transistor T27 is added again and the main electrodes of the transistors T1 and T2 are further coupled both the terminal 10 and the supply-voltage terminal Vdd by means of a set of resistors R41, R42 and R43. The second means M2 comprise a circuit as shown in FIG. 3, but in which the second current mirror (T10, T11, T12) has been replaced by a current source J11 coupled to the second main electrode of the transistor T7 and by a current source J12 coupled to the second main electrode of the transistor T8. The first main electrodes of the transistors T7 and T8 are further coupled to both the terminal 9 and the supply-voltage terminal Vss by a set of resistors R31, R32 and R33. The third means M3 comprise a circuit as shown in FIG. 4. The present embodiment provides a simple method of protecting a bridge amplifier arrangement, the operation of this embodiment not being different from that of the embodiments described with reference to the preceding Figures.

The invention is not limited to the embodiments disclosed herein. Within the scope of the invention several modifications are conceivable to those skilled in the art. For example, the first means M1 and the second means M2 can be constructed in a variety of ways, which also applies to the third means M3, which used not necessarily receive two signals of opposite polarity. However, in that case a threshold circuit is required, which may operate with a variable related threshold value.

We claim:

1. An amplifier arrangement comprising: a first amplifier having a first output terminal for connection to a first terminal of a load and having at least a first transistor for supplying a first current related to a first load current flowing via the first output terminal, first means for generating a first signal which is a measure of the first current, a second amplifier having a second output terminal for connection to a second terminal of the load and having at least a second transistor for supplying a second current related to a second load current flowing via the second output terminal, second means for generating a second signal which is a measure of the second current, protection means for limiting the first and the second load current, and third means for generating a first control signal having one given polarity for a short-circuit to a first or a second supply voltage terminal of the amplifier arrangement, and wherein the first control signal is a measure of the sum of the first and the second signal and controls the protection means which in response limits the respective load current in the event of a short-circuit to said first or second supply voltage terminal.

2. An amplifier arrangement comprising: a first amplifier having a first output terminal for connection to a first terminal of a load and having at least a first transistor for supplying a first current related to a first load current flowing via the first output terminal, first means for generating a first signal which is a measure of the first current, a second amplifier having a second output terminal for connection to a second terminal of the load and having at least a second transistor for supplying a second current related to a second load current flowing via the second output terminal, second means for generating a second signal which is a measure of the second current, protection means for limiting the first and the second load current in order to protect the first and the second amplifier, and third means for generating a first control signal which is a measure of the sum of the first and the second signal and which controls the protection means, and wherein the third means comprise a current mirror having an input terminal for supplying the first signal and the second signal and an output terminal for supplying the first control signal.

3. An amplifier arrangement as claimed in claim 2, wherein the input terminal of the current mirror and the output terminal of the current mirror are coupled to one another by means of two series-coupled transistors each having a control electrode, a first main electrode and a second main electrode, the two control electrodes being coupled to a reference voltage terminal to receive a reference voltage, the two first main electrodes being coupled to a third terminal to receive both the first and the second signal, and the second main electrodes being coupled to the input terminal and the output terminal, respectively of the current mirror.

4. An amplifier arrangement as claimed in claim 3, wherein the first means comprise at least two transistors each having a control electrode, a first main electrode and a second main electrode, the control electrodes being coupled both to one another and to one first main electrode, the first main electrodes each being coupled to a current source, and the second main electrodes being coupled to one another by means of a pair of series-coupled resistors, one second main electrode being coupled to an input terminal to receive at least the first current and the other second main electrode being coupled to an output terminal to supply the first signal, and the second means comprise at least two transistors each having a control electrode, a first main electrode and a second main electrode, the control electrodes being coupled both to each other and to one first main electrode, the first main electrodes each being coupled to a current source, and the second main electrodes being coupled to one another by means of a second pair of series-coupled resistors, one second main electrode being coupled to an input terminal to receive at least the second current and the other second main electrode being coupled to an output terminal to supply the second signal.

5. An amplifier arrangement as claimed in claim 4, wherein the first amplifier further comprises at least a third transistor for supplying a third current related to the first load current flowing via the first output terminal, the first means are adapted to generate also a third signal which is a measure of the third current, the second amplifier further comprises at least a fourth transistor for supplying a fourth current related to the second load current flowing via the second output terminal, the second means are adapted to generate also a fourth signal which is a measure of the fourth current, and the third means are adapted to generate also a second control signal which is a measure of the sum of the third and the fourth signals and which serves to control the protection means.

6. An amplifier arrangement as claimed in claim 5, wherein the third means comprise two substantially identical devices for generating the first and the second control signals, respectively.

7. An amplifier arrangement as claimed in claim 5, wherein the first means further comprise at least two further comprise at least two further transistors each having a control electrode, a first main electrode and a second main electrode, the control electrodes being coupled both to each other and to one first main electrode, the first main electrodes each being coupled to a current source, and the second main electrodes being coupled to each other by means of a third pair of series-coupled resistors, one second main electrode being coupled to an input terminal to receive the third current and the other second main electrode being coupled to an output terminal to supply the third signal, and the second means comprise at least two transistors each having a control electrode, a first main electrode and a second main electrode, the control electrodes being coupled both to one another and to one first main electrode, the first main electrodes each being coupled to a current source, and the second main electrodes being coupled to one another by means of a fourth pair of series-coupled resistors, one second main electrode being coupled to an input terminal to receive the fourth current and the other second main electrode being coupled to an output terminal to supply the fourth signal.

8. An amplifier arrangement comprising: a first amplifier having a first output terminal for connection to a first terminal of a load and having at least a first transistor for supplying a first current related to a first load current flowing via the first output terminal, first means for generating a first signal which is a measure of the first current, a second amplifier having a second output terminal for connection to a second terminal of the load and having at least a second transistor for supplying a second current related to a second load current flowing via the second output terminal, second means for generating a second signal which is a measure of the second current, protection means for limiting the first and the second load current in order to protect the first and the second amplifier, and third means for generating a first control signal which is a measure of the sum of the first and the second signal which controls the protection means, wherein the first amplifier further comprises at least a third transistor for supplying a third current related to the first load current flowing via the first output terminal, and the second amplifier further comprises at least a fourth transistor for supplying a fourth current related to the second load current flowing via the second output terminal, and wherein the first signal is a measure of both the first and the fourth current and the second signal is a measure of both the second and third current.

9. An amplifier arrangement as claimed in claim 1, wherein at least one of the means is further adapted to generate at least one further control signal which is a measure of the current through at least one of the first and second transistors and which is operative to control the protection means.

10. An amplifier arrangement comprising: a first amplifier having a first output terminal for connection to a first terminal of a load and having at least a first transistor for supplying a first current related to a first load current flowing via the first output terminal, first means for generating a first signal which is a measure of the first current, a second amplifier having a second output terminal for connection to a second terminal of the load and having at least a second transistor for supplying a second current related to a second load current flowing via the second output terminal, second means for generating a second signal which is a measure of the second current, protection means for limiting the first and the second load current in order to protect the first and the second amplifier, and third means for generating a first control signal which is a measure of the sum of the first and the second signal which controls the protection means, and wherein the first means comprise at least two transistors each having a control electrode, a first main electrode and a second main electrode, the control electrodes being coupled both to one another and to one first main electrode, the first main electrodes each being coupled to a current source, and the second main electrodes being coupled to one another by means of a pair of series-coupled resistors, one second main electrode being coupled to an input terminal to receive at least the first current and the other second main electrode being coupled to an output terminal to supply the first signal, and the second means comprise at least two transistors each having a control electrode, a first main electrode and a second main electrode, the control electrodes being coupled both to each other and to one first main electrode, the first main electrodes each being coupled to a current source, and the second main electrodes being coupled to one another by means of a second pair of series-coupled resistors, one second main electrode being coupled to an input terminal to receive at least the second current and the other second main electrode being coupled to an output terminal to supply the second signal.

11. An amplifier arrangement as claim in claim 10, wherein the first amplifier further comprises at least a third transistor for supplying a third current related to the first load current flowing via the first output terminal, the first means are adapted to generate also a third signal which is a measure of the third current, the second amplifier further comprises at least a fourth transistor for supplying a fourth current related to the second load current flowing via the second output terminal, the second means are adapted to generate also a fourth signal which is a measure of the fourth current, and the third means are adapted to generate also a second control signal which is a measure of the sum of the third and the fourth signals and which controls the protection means.

12. An amplifier arrangement comprising: a first amplifier having a first output terminal for connection to a first terminal of a load and having at least a first transistor for supplying a first current related to a first load current flowing via the first output terminal, first means for generating a first signal which is a measure of the first current, a second amplifier having a second output terminal for connection to a second terminal of the load and having at least a second transistor for supplying a second current related to a second load current flowing via the second output terminal, second means for generating a second signal which is a measure of the second current, protection means for limiting the first and the second load current in order to protect the first and the second amplifier, and third means for generating a first control signal which is a measure of the sum of the first and the second signal which controls the protection means, and wherein the first amplifier further comprises at least a third transistor for supplying a third current related to the first load current flowing via the first output terminal, the first means are adapted to generate also a third signal which is a measure of the third current, the second amplifier further comprises at least a fourth transistor for supplying a fourth current related to the second load current flowing via the second output terminal, the second means are adapted to generate also a fourth signal which is a measure of the fourth current, and the third means are adapted to generate also a second control signal which is a measure of the sum of the third and the fourth signals and which controls the protection means.

13. An amplifier arrangement as claimed in claim 12, wherein the first means further comprise at least two further transistors each having a control electrode, a first main electrode and a second main electrode, the control electrodes being coupled both to each other and to one first main electrode, the first main electrodes each being coupled to a current source, and the second main electrodes being coupled to each other by means of a third pair of series-coupled resistors, one second main electrode being coupled to an input terminal to receive the third current and the other second main electrode being coupled to an output terminal to supply the third signal, and the second means comprise at least two transistors each having a control electrode, a first main electrode and a second main electrode, the control electrodes being coupled both to one another and to one first main electrode, the first main electrodes each being coupled to a current source, and the second main electrodes being coupled to one another by means of a fourth pair of series-coupled resistors, one second main electrode being coupled to an input terminal to receive the fourth current and the other second main electrode being coupled to an output terminal to supply the fourth signal.

14. An amplifier arrangement as claim in claim 3, wherein the first amplifier further comprises at least a third transistor for supplying a third current related to the first load current flowing via the first output terminal, the first means are adapted to generate also a third signal which is a measure of the third current, the second amplifier further comprises at least a fourth transistor for supplying a fourth current related to the second load current flowing via the second output terminal, the second means are adapted to generate also a fourth signal which is a measure of the fourth current, and the third means are adapted to generate also a second control signal which is a measure of the sum of the third and the fourth signals and which serves to control the protection means.

15. An amplifier arrangement as claimed in claim 3, wherein the first amplifier further comprises at least a third transistor for supplying a third current related to the first load current flowing via the first output terminal, and the second amplifier further comprises at least a fourth transistor for supplying a fourth current related to the second load current flowing via the second output terminal, and wherein the first signal is a measure of both the first and the fourth current and the second signal is a measure of both the second and the third current.

16. An amplifier arrangement as claimed in claim 10, wherein the first amplifier further comprises at least a third transistor for supplying a third current related to the first load current flowing via the first output terminal, and the second amplifier further comprises at least a fourth transistor for supplying a fourth current related to the second load current flowing via the second output terminal, and wherein the first signal is a measure of both the first and the fourth current and the second signal is a measure of both the second and the third current.

17. An amplifier arrangement as claimed in claim 3, wherein at least one of the means is further adapted to generate at least one further control signal which is a measure of the current through at least one of the first and second transistors and which controls the protection means.

18. An amplifier arrangement as claimed in claim 10, wherein at least one of the means is further adapted to generate at least one further control signal which is a measure of the current through at least one of the first and second transistors and which controls the protection means.

* * * * *